United States Patent
Makkar et al.

(10) Patent No.: US 10,948,538 B2
(45) Date of Patent: Mar. 16, 2021

(54) REGISTER FOR AT-SPEED SCAN TESTING

(71) Applicant: NXP USA, INC., Austin, TX (US)

(72) Inventors: Shikhar Makkar, Palwal (IN); Dimple Aggarwal, Noida (IN); Nitin Anand, Sitamarhi (IN); Manmohan Rana, Ghaziabad (IN)

(73) Assignee: NXP USA, INC., Austin, TX (US)

( * ) Notice: Subject to any disclaimer, the term of this patent is extended or adjusted under 35 U.S.C. 154(b) by 33 days.

(21) Appl. No.: 16/435,531

(22) Filed: Jun. 9, 2019

(65) Prior Publication Data

US 2020/0386808 A1 Dec. 10, 2020

(51) Int. Cl.
*G01R 31/3177* (2006.01)
*G11C 19/28* (2006.01)
*G01R 31/317* (2006.01)

(52) U.S. Cl.
CPC ... *G01R 31/3177* (2013.01); *G01R 31/31725* (2013.01); *G11C 19/28* (2013.01)

(58) Field of Classification Search
CPC .......... G01R 31/3177; G01R 31/31725; G11C 19/28
See application file for complete search history.

(56) References Cited

U.S. PATENT DOCUMENTS

| 8,975,933 | B1 * | 3/2015 | Holzman | H03K 3/012 327/198 |
| 9,046,574 | B2 | 6/2015 | Giles et al. | |
| 2005/0280459 | A1 * | 12/2005 | Inoue | H03K 3/012 327/203 |

OTHER PUBLICATIONS

Amit Mishra, Nidhi Sinha, Satdev, Virendra Singh, Sreejit Chakravarty and Adit D. Singh, "Modified Scan Flip-Flop for Low Power Testing", 2010 19th IEEE Asian Test Symposium, IEEE Computer Society 1081-7735/10, 2010.
Benoit Nadeau-Dostie, Kiyoshi Takeshita, Jean-François Côté, "Power-Aware At-Speed Scan Test Methodology for Circuits with Synchronous Clock", Paper 9.3 IEEE International Test Conference 11-4244-4203-0/08/, 2008.

* cited by examiner

*Primary Examiner* — Thien Nguyen

(57) ABSTRACT

An integrated circuit (IC) has scan chains of stitched registers that support scan testing of functional logic. The scan testing has a shift phase in which incoming and outgoing data are shifted into and out of the registers using a slow clock and a capture phase in which outgoing data from the functional logic is captured by the registers using launch-and-capture pulses of a fast clock to check for delay faults. During a warm-up period after termination of the slow clock but before application of the launch-and-capture pulses, the registers propagate data through their master latches without affecting the data stored in their slave latches. A warm-up controller configures the registers and generates control signals to perform either launch-on-shift or launch-on-capture scan testing. The flow of data and the warm-up controller operations keep the power supply rail voltage sufficiently charged for the fast launch-and-capture pulses.

13 Claims, 12 Drawing Sheets

REGISTER FOR AT-SPEED SCAN TESTING

BACKGROUND

The present invention relates generally to electronics and, more particularly, to scan testing of integrated circuitry.

Some integrated circuits (ICs), such as system-on-chip (SoC) devices, have multiple registers (e.g., flip-flops) that are stitched into scan chains to enable scan testing of the IC to detect structural faults in the functional logic of the IC and where at-speed patterns are used to check for delay faults in the functional logic. These scan chains are stitched between a decompressor, which functions as a stimulus generator for the logic under test, and a compactor, which functions as a signature generator for the corresponding response captured from the logic under test. Such scan testing is well known and typically performed through shift and capture phases of multiple scan-test cycles with different stimuli orchestrated by off-chip tester equipment (i.e., an automatic test-pattern generation (ATPG) tool), where each shift Phase is driven using a relatively slow tester clock provided by the ATPG tool and each capture phase is driven using a relatively fast at-speed clock generated by on-chip clock (OCC) circuitry.

FIG. 1 is a block diagram of conventional, on-chip scan-testing circuitry 100 for an SoC or other IC having computational logic (not shown in FIG. 1). The scan-testing circuitry 100 includes (i) a decompressor 110 (e.g., a linear feedback shift register (LFSR) running on the tester clock 104) that receives a series of scan-test sequences 102 provided by tester-controlled channels and distributes incoming binary data sequences 112 to m different scan chains 120, each having n registers (not shown in FIG. 1) and (ii) a compactor 130 that receives outgoing binary data sequences 122 from the scan chains 120 and generates a corresponding series of scan-test results 132 that can be analyzed by off-chip tester equipment (not shown in FIG. 1) to detect structural faults and delay faults in the logic under test.

During the shift phase of each cycle of scan testing, the first register in each scan chain 120 is configured to receive its data input 112 from the decompressor 110 and each other register in each scan chain 120 is configured to receive its data input from the previous register in the corresponding scan chain 120. During the capture phase, each register is configured to receive its data input from the IC's functional logic, which can be either combinational logic or sequential logic.

For a given cycle of scan testing, a set of the incoming binary data sequences 112 are clocked into the registers of the scan chains 120 during the shift phase using the slow tester clock, such that, at the end of the shift phase, each register stores a different bit of a corresponding data sequence 112.

At the transition from the end of the shift phase and the beginning of the capture phase, the registers are re-configured to receive their data inputs from the functional logic.

During the capture phase, the binary output data from the functional logic, i.e., the results generated by applying the incoming data sequences 112 to the functional logic, are stored in the registers of the scan chains 120 using two pulses of the fast at-speed clock: (i) a launch pulse to move data d of each launch register to its output q to be applied to functional logic that generates the input d for each capture register and (ii) a capture pulse to move data d of each capture register to its output q. The launch registers are those registers of the scan chains 120 that provide input test data to the functional logic, while the capture registers are those registers of the scan chains 120 that receive corresponding output test data from the functional logic. A launch register can also be a capture register for some part of the testing of the functional logic, and a capture register can be a launch register for some other part of the testing of the functional logic.

During the shift phase of the next scan-testing cycle, as the binary data for the next set of test sequences 112 from the decompressor 110 are shifted into the registers of the scan chains 120, the test results 122 from the previous scan-testing cycle are shifted out of those registers into the compactor 130.

Since the ATPG tool might not be able to provide clocks in the range of hundreds of MHz or even GHz at which modern SoCs work, OCC controller circuitry typically is used to extract from OCC sources such as phase-locked loops (PLLs) using pre-programmed registers (i.e., OCC configuration bits) the at-speed launch and capture pulses of the capture phase. The circuitry used for such purpose is put out of scan in at-speed mode to preserve pre-programmed values.

FIGS. 2A and 2B are schematic block diagrams of each scan chain 120 of the scan-testing circuitry 100 of FIG. 1, in which each scan chain 120 has five registers 230(1)-230(5) stitched together. Note that, in a typical real-world implementation, each scan chain 120 would have many more than just five registers 230. In particular, FIG. 2A shows the scan chain 120 configured for the shift phase of scan testing, while FIG. 2B shows the same scan chain 120 configured for the capture phase of at-speed scan testing.

In both FIGS. 2A and 2B, the scan-data input (sdi) port of the first register 230(1) is connected to receive the decompressor output data 112, each sdi port of every other register 230 is connected to the scan-data output (sdo) port of the previous register 230, and the sdo port of the last register 230(5) is connected to transmit the compactor input data 122. The scan enable (se) port of each register 230 receives a top-level scan-enable control signal 202 that is typically applied to the IC by the ATPG tool, and the clock (ck) port of each register 230 is connected to the clock output (ck_out) port of a clock gate 220.

The clock input (ck_in) of the clock gate 220 is connected to the output 206 of a (2×1) clock multiplexer (mux) 204 that receives, at its two inputs, (i) the relatively slow, tester clock from the ATPG tool and (ii) the relatively fast, at-speed clock from the OCC circuitry. The clock mux 204 also receives a clock-select control signal 208 that determines whether the tester clock or the at-speed clock is applied as the clock signal 206 to the ck_in port of the clock gate 220. The clock-select control signal 208 depends on the type of tests being run on the logic under test. For DC faults, like stuck-at faults, the mux select is constant 1, and the slow tester clock is the clock source for both the shift and capture phases. For AC faults, like delay faults, the clock-select control signal 208 switches from 1 to 0 while moving from the shift phase to the capture phase in order to switch from the slow tester clock to the fast at-speed clock.

As also shown in FIGS. 2A and 2B, the clock enable (ck_en) input of the clock gate 220 is connected to the output 214 of a (2×1) data mux 212 that receives, at its two input ports, (i) a constant 1 to make the clock gate transparent during the shift phase (ii) the logical AND of the enable from OCC configuration registers and the enable for the clock domain from an AND gate 210. The data mux 212 also receives the scan-enable control signal 202 as a data-select control signal.

The q data outputs of the first and second registers 230(1) and 230(2) are shown connected to the IC's functional logic 240, and the d data input of the fourth register 230(4) is shown connected to the functional logic 240. Although not explicitly represented, the d data input and the q data output of each register 230 may be connected to the functional logic 240.

When the top-level scan-enable control signal 202 is high (i.e., logic 1), each register 230 is configured in its shift configuration in which the data appearing at the sdi input port is forwarded to the sdo and q outputs as the register 230 is clocked. When the top-level scan-enable control signal 202 is low (i.e., zero or ground value), each register 230 is configured in its capture configuration in which the data appearing at the d input port is forwarded to the sdo and q output ports as the register 230 is clocked.

As shown in FIG. 2A, during the shift phase of scan testing, (i) the clock signal 206 applied to the ck_in port of the clock gate 220 is the slow tester clock received from the off-chip tester equipment and (ii) the top-level scan-enable control signal 202 is high (i.e., logic value 1), which configures each register 230 to accept the input data applied to its sdi data input port at each clock cycle. Note that the top-level scan-enable control signal 202 is also applied to the clock enable (ck_en) port of the clock gate 220, such that, when the top-level scan-enable control signal 202 is high, the tester clock is applied as the clock signal 222 to the ck clock ports of the registers 230. As such, during the shift phase, the data appearing az the sdi data input of each register 230 is presented at both the sdo and the q data outputs, but the data applied at only the sdi data inputs are shifted into the registers 230, thereby simultaneously shifting data into and out of the registers 230 during the shift phase.

As shown in FIG. 2B, during the capture phase of at-speed scan testing, (i) the clock signal 206 applied to the ck_in input of the clock gate 220 is the fast at-speed clock generated on the IC and (ii) the top-level scan-enable control signal 202 is low, which configures each register 230 to accept the input data applied to its d data input at each clock cycle.

Note that a different clock-enable control signal 206 generated by an on-chip OCC controller (not shown) is applied to the ck_en input of the clock gate 220, such that, when the clock-enable control signal 206 is high, the at-speed clock is applied as the clock signal 222 to the ck clock ports of the registers 230. The on-chip OCC controller generates the clock-enable control signal 206 to allow only two pulses of the at-speed clock (i.e., the launch pulse and the capture pulse) to be applied to the registers 230 during the capture phase.

As such, during the two pulses of the capture phase, the data appearing at the d input of each register 230 is presented at both the sdo and the q data outputs, but the data applied at only the d inputs are stored into the registers 230, thereby moving the output data from the functional logic 240 into the registers 230 during the capture phase.

FIG. 3 is a schematic circuit diagram one of the registers 230 of FIGS. 2A and 2B. The register 230 has a (2×1) input multiplexer (mux) 310, a master latch 320, and a slave latch 330, where the master latch 320 has two transmission gates TG1 and TG2 and two inverters INV1 and INV2, and the slave larch 330 also has two transmission gates TG3 and TG4 and two inverters INV3 and INV4. Note that the transmission gates TG1 and TG4 turn on when the clock signal ck goes low and turn off when the clock signal ck goes high, while the transmission gates TG2 and TG3 turn on when the clock signal ck goes high and turn off when the clock signal ck goes low.

When the top-level scan-enable (se) control signal 202 is high, the mux 310 applies the sdi data signal to the first transmission gate TG1 of the master latch 320, and, when the se control signal 202 is low, the mux 310 applies the d data signal to the first transmission gate TG1. Either way, as the clock signal ck cycles, the applied data signal is latched first into the master latch 320 during the low portion of a clock cycle and then into the slave latch 330 during the high portion of that same clock cycle.

The switching of clocks from the slow tester clock used during each shift phase to the fast at-speed clock used during the subsequent capture phase introduces a "dead time" between the end of the shift-phase clock pulses and the beginning of the two capture-phase clock pulses. Since activity is substantially nonexistent during this period, the on-chip regulator can go into a "cold" state as current demand drops during the dead time. The arrival of the launch and capture pulses causes a sudden increase in current demand due to the logic operating at full speed during the capture phase. The on-chip regulator might not be able to provide sufficient current during this time (as regulator bandwidth might not be sufficient to respond quickly to this current demand), and this can cause a momentary supply drop, which can lead to false negative scan-testing results, where increased register delay (due to voltage drop) is misinterpreted as functional logic failure.

FIG. 4 is a timing diagram showing waveforms for the top level scan-enable control signal 202, the clock-enable signal ck_en of the clock gate 220, the clock signal 222 applied to the registers 230, and the power supply positive rail voltage for the conventional scan-testing circuitry 100 of FIGS. 1-3. As represented in FIG. 4, from time t0 to time t1, the scan testing is in shift phase, and from time t1 to time t4, the scan testing is in the capture phase.

In particular, from time t0 to time t1 of the shift phase, the slow tester clock pulses are applied to the registers 230 as the clock signal 222. At time t1, after the last tester clock pulse is applied, the scan-enable control signal 202 is driven low, thereby ending the shift phase and beginning the capture phase. At the same time, the clock enable signal ck_en is driven low, thereby ceasing to apply any clock pulses to the registers 230.

During the time period from time t1 to time t2, the clock signal 206 applied to ck_in port of the clock gate 220 is switched from the slow tester clock to the fast at-speed clock. During that time period, no clock pulses are applied to the registers 230 and, due to the inactivity in most of the logic under test (only the OCC circuitry contributes to activity which is almost nil in comparison to the shift phase activity), the power supply positive rail voltage begins to droop. A clock cycle before time t2, the clock enable signal ck_en is driven high such that the at-speed launch and capture pulses in the clock signal 222 are applied to the registers 230 at time t2 and time t3, respectively. During that time period, the power supply positive rail voltage drops significantly, which can cause increased register delay that can be misinterpreted as failures in the functional logic 240. Accordingly, it would be advantageous to have circuitry that prevents sudden increases in current demand and thereby prevents corruption of the scan testing.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Figure 1:
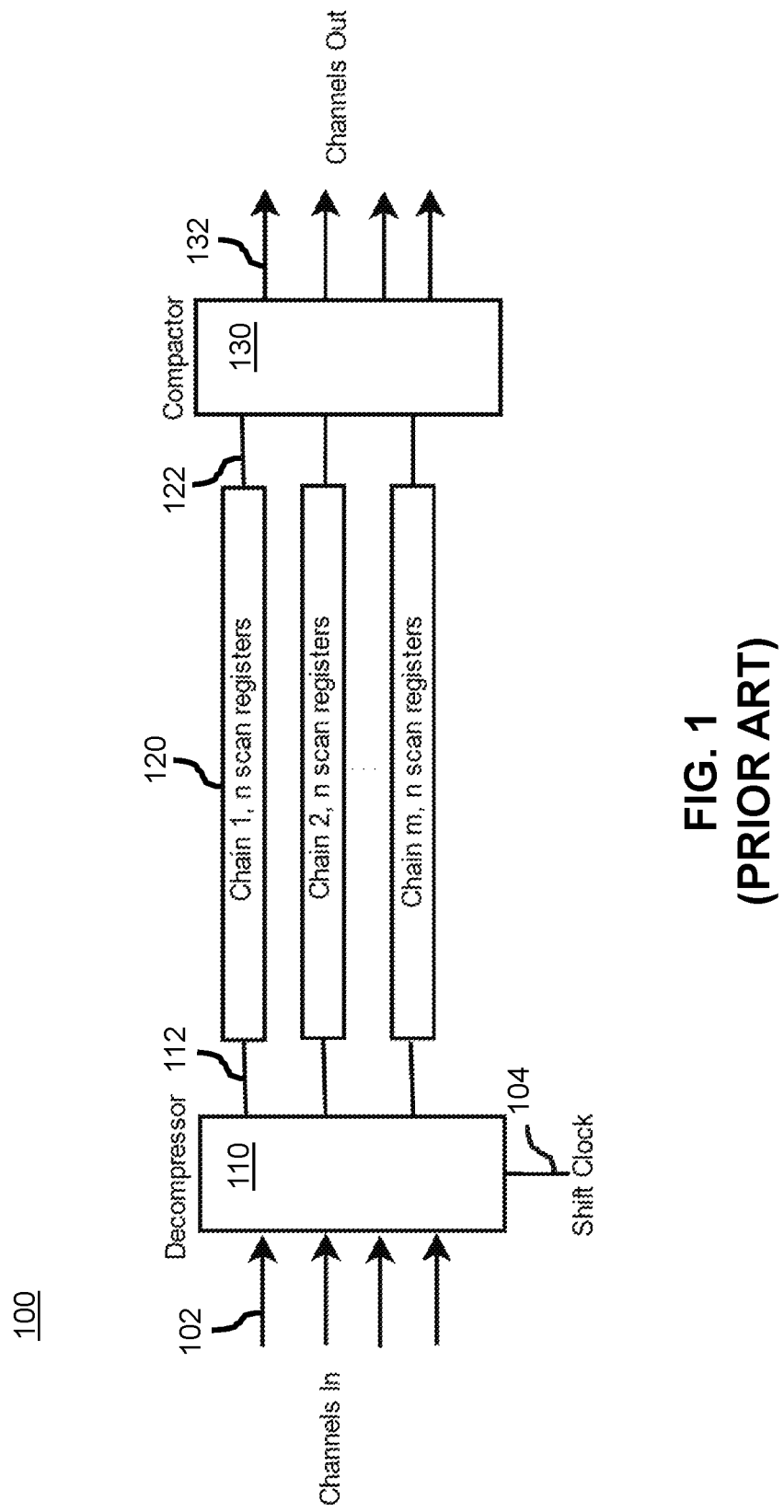
FIG. 1 is a block diagram of conventional, on-chip scan-testing circuitry for an integrated circuit.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

As described in the Background section, there is a need to ensure that the scan chains that receive the at-speed launch and capture pulses of the capture phase of scan testing are supplied with sufficient voltage to operate properly. This can be achieved by using an extended scan-enable, post-shift phase to provide "warm-up" pulses. This involves restoration or preservation of the initialization vector generated by the off-chip tester equipment. At-speed testing requires three vectors: an initialization vector, a launch vector, and a capture vector. The initialization vector is used to set the functional logic under test to the opposite value of the fault being tested. The launch vector will set the value equivalent to the fault being tested, and the capture vector will capture the transition. For example, for a delay fault for a "slow-to-fall" transition of 1 to 0, the initialization vector will be 1, the launch vector will be 0, and the capture vector will capture a 0, and vice versa for a delay fault for a "slow-to-rise" transition of 0 to 1. Not restoring/preserving the initialization vector will lead to a loss in delay test coverage along with an increase in pattern count, thus lowering test quality and increasing test cost. Restoring the initialization vector involves extra circuitry that is added at the physical/synthesis level post-scan stitching. This leads to an increase in the design cycle time, a larger silicon area, and the need for special care during ATPG so that the restoration circuitry functions as desired.

Thus, there is a need for scan-testing circuitry that (a) restores or preserves the initialization vector generated by the off-chip tester equipment; (b) generates an extended scan-enable period that provides warm-up pulses; (c) has little or no physical/synthesis-level dependencies with respect to the number of warm-up cycles, restoration of initialization vector, and silicon area; and (d) has little or no impact on test coverage and test time and thus does not compromise silicon quality and test cost.

The present invention solves the problem of power supply rail droop during scan testing by using scan-chain registers that can be partially operated during a warm-up period between the end of the shift phase and the application of the at-speed launch and capture pulses of the capture phase to ensure that the power supply rails have sufficient voltage when the launch and capture pulses are applied to the scan chains.

Without limitation, the following characteristics apply to an integrated circuit (IC) of the present invention: (a) the IC can have multiple clock domains, of which some are synchronous to each other referred to as synchronous groups and the rest being asynchronous; (b) to improve controllability and observability, the IC has many registers that can be stitched into scan chains that are fed by a decompressor and whose outputs feed a compactor to form the signature value; (c) each scan chain has registers belonging to only a single clock domain and registers belonging to a different clock domain are stitched in a different chain; (d) a register (described below in the context of FIG. 5) that supports a warm-up configuration in which the slave latch is bypassed. The register includes an extra pin to implement the warm-up function. Warm-up pulses are provided when the scan-enable control signal coming from the off-chip tester equipment makes a transition from high (i.e., shift phase) to low (i.e., capture phase); (e) the extra pin is controlled with a warm-up controller (described below in the context of FIG. 8); (f) the warm-up controller uses a pipeline scan enable to keep the registers stitched in a scan chain in the shift register configuration (i.e., the sdi input port is selected rather than the d input port) when warm-up pulses are being provided to the IC. When warm-up pulses are being provided to the IC, the registers have their slave latches bypassed, and inverters in the master latches of the registers stitched in a scan chain are connected back to back and form a long chain of inverters for that specific scan chain; and (g) the warm-up controller preferably supports both launch-on-shift (LOS) scan testing and launch-on-capture (LOC) scan testing.

According to certain embodiments of the present invention, an integrated circuit has functional logic and registers. The functional logic processes incoming data to generate corresponding outgoing data. The registers are stitched into a scan chain that supports scan testing of the functional logic under test. Each register comprises a master latch followed by a slave latch and supports: (i) a normal configuration in which the slave latch is connected to a first output port of the register and (ii) a warm-up configuration in which a node in the master latch is connected directly to the first output port of the register bypassing the slave latch.

Figure 2A:
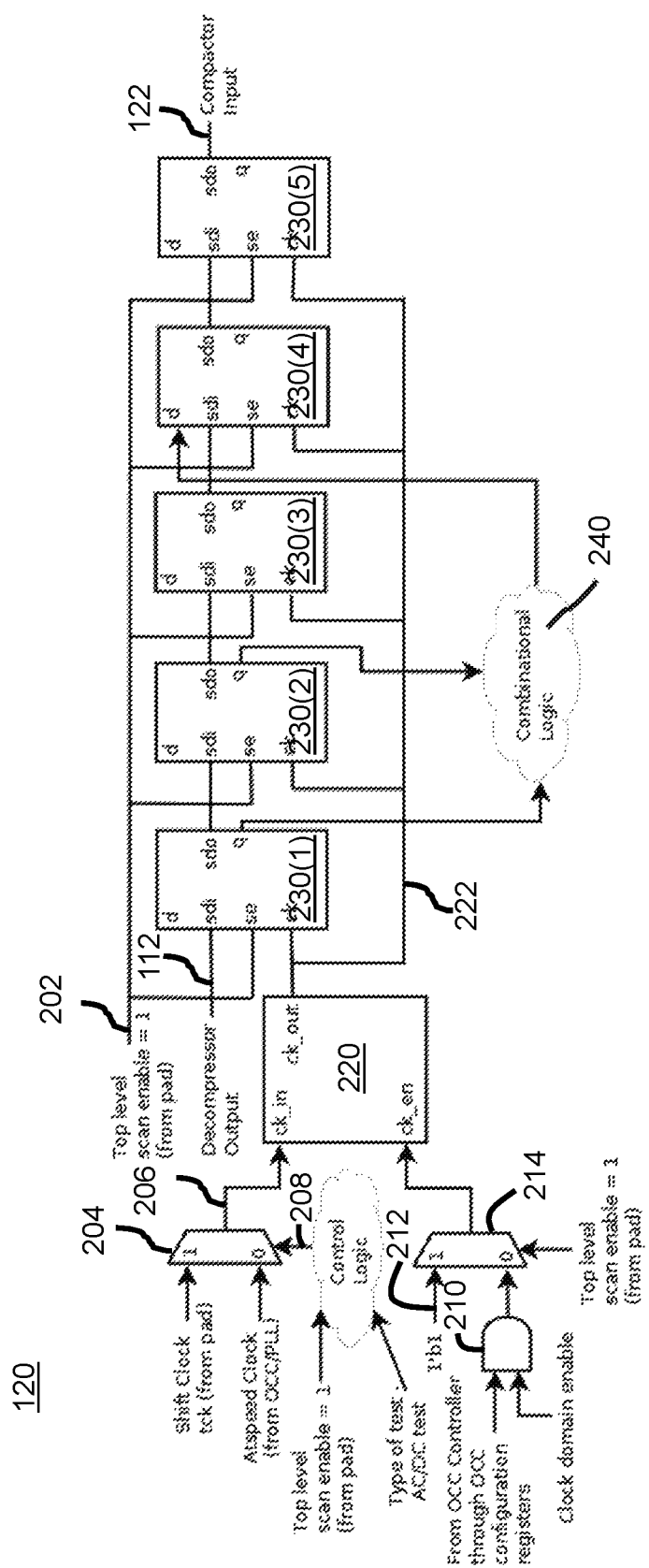
FIGS. 2A and 2B are schematic block diagrams of conventional scan chain circuitry for each scan chain of the scan-testing circuitry of FIG. 1 respectively configured for the shift phase and the capture phase of scan testing.
Figure 2B:
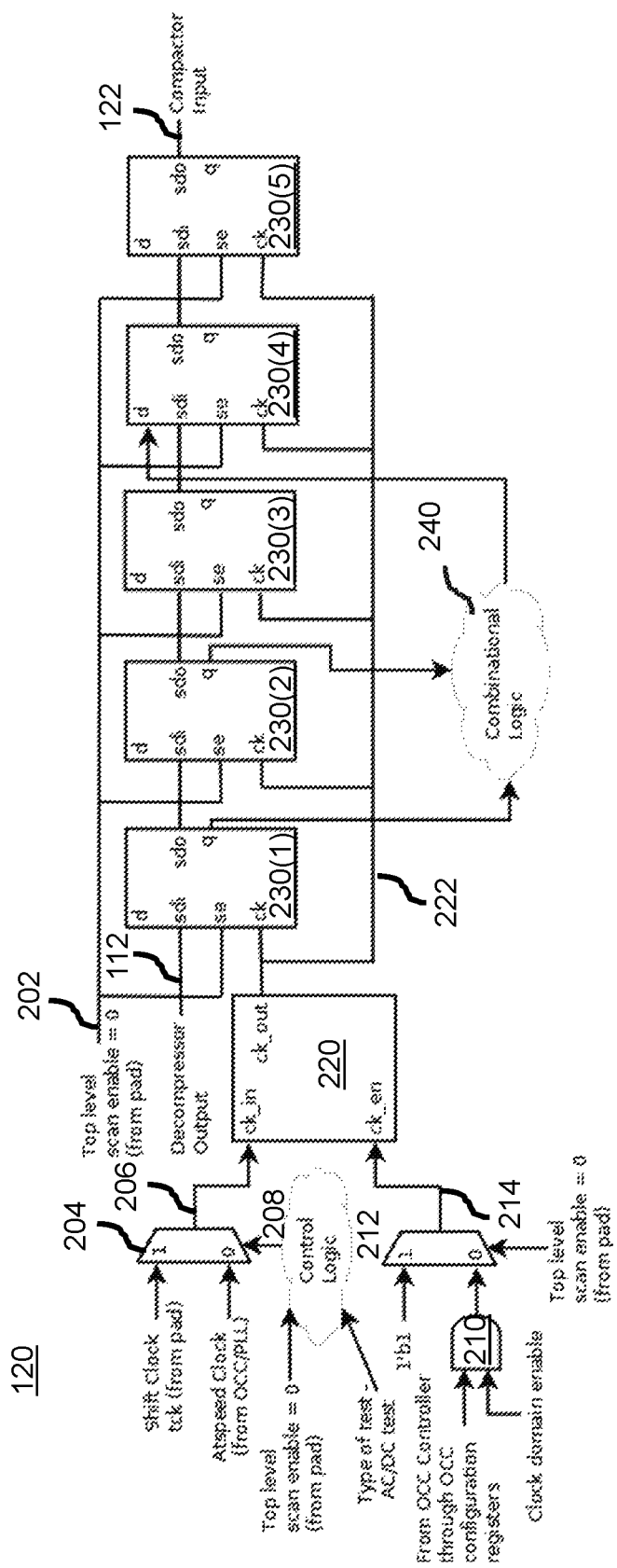
Figure 5A:
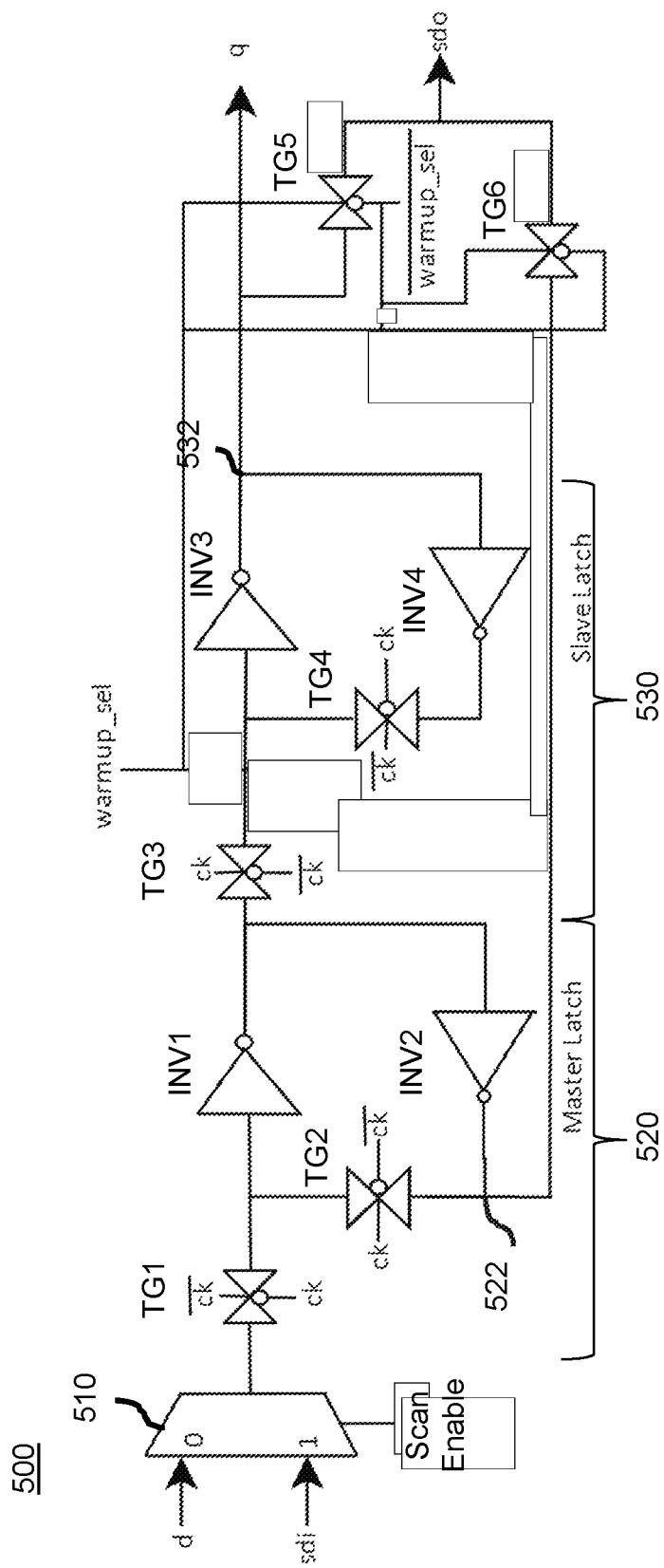
FIG. 5A is a schematic circuit diagram of a register in accordance with an embodiment of the present invention.

FIG. 5A is a schematic circuit diagram of one possible implementation of a register (i.e., flip-flop) 500 that can be used instead of the register 230 of FIGS. 2A and 2B for the registers of one or more of even all of the scan chains in an embodiment of scan-testing circuitry according to the present invention that is analogous to the scan-testing circuitry 100 of FIG. 1.

The register 500 has the following pins:

se: The scan-enable pin receives a scan-enable control signal to switch from the shift data input (sdi) to the functional input (a) while moving from the shift phase (se pin is high) to the capture phase (se pin is low). For registers working on warm-up, the se pin will be driven by the pipeline_se control signal generated by the warm-up controller 800 of FIG. 8;

ck: The clock pin receives the slower, tester clock signal during both the shift and capture phases of the stuck-at scan mode and switches to the faster, at-speed clock signal provided by the OCC during the capture phase of the at-speed scan mode;

d: The d data input pin provides data to the register 500 when the se pin is low;

sdi: The scan-data input pin provides data to the register 500 when the se pin is high;

q: The q data output drives the IC's functional logic during both the shift and capture phases of scan testing; and sdo: The scan-data output drives the shift data to the sdi input of the next register 500 in the scan chain.

Like the register 230 of FIGS. 2A and 2B, the register 500 has an analogous input mux 510, an analogous master latch 520, and an analogous slave latch 530. In addition, the register 500 also has two additional transmission gates TG5 and TG6, where (i) TG5 is connected between the output node 532 of the slave latch 530 and the register's sdo output port and (ii) TG6 is connected between the internal node 522 within the master latch 520 and the register's sdo output port. The transmission gates TG5 and TG6 are controlled by a warm-up select (warmup_sel) control signal, where TG5 is on and TG6 is off when warmup_sel is high, and TG5 is off and TG6 is on when warmup_sel is low. Thus, when warmup_sel is low, the signal at node 532 (i.e., the bit value stored in the slave latch 530) is applied to the sdo output port and, when warmup_sel is high, the signal at node 522 is applied to the sdo output port.

The purpose of adding the transmission gates TG5 and TG6 is to enable the register 500 to be configured into a warm-up configuration in which at least some of the circuitry within the register 500 operates during the warm-up period of scan testing between the end of the shift phase and the application of the launch and capture pulses of the capture phase in order to ensure that there is a current load seen by the power management circuit/controller (PMC) during the warm-up phase, and the jump in current from the dead-time cycles to the launch and capture cycles is reduced, which ensures that the power supply rails have sufficient voltage to properly drive all of the registers in all of the scan chains when the launch and capture pulses are applied, but without modifying the data stored in the scan chains during that warm-up period. The PMC comprises the voltage regulators and is responsible for providing power to the circuit. In this way, the register 500 ensures preservation of the initialization vector.

Figure 5B:
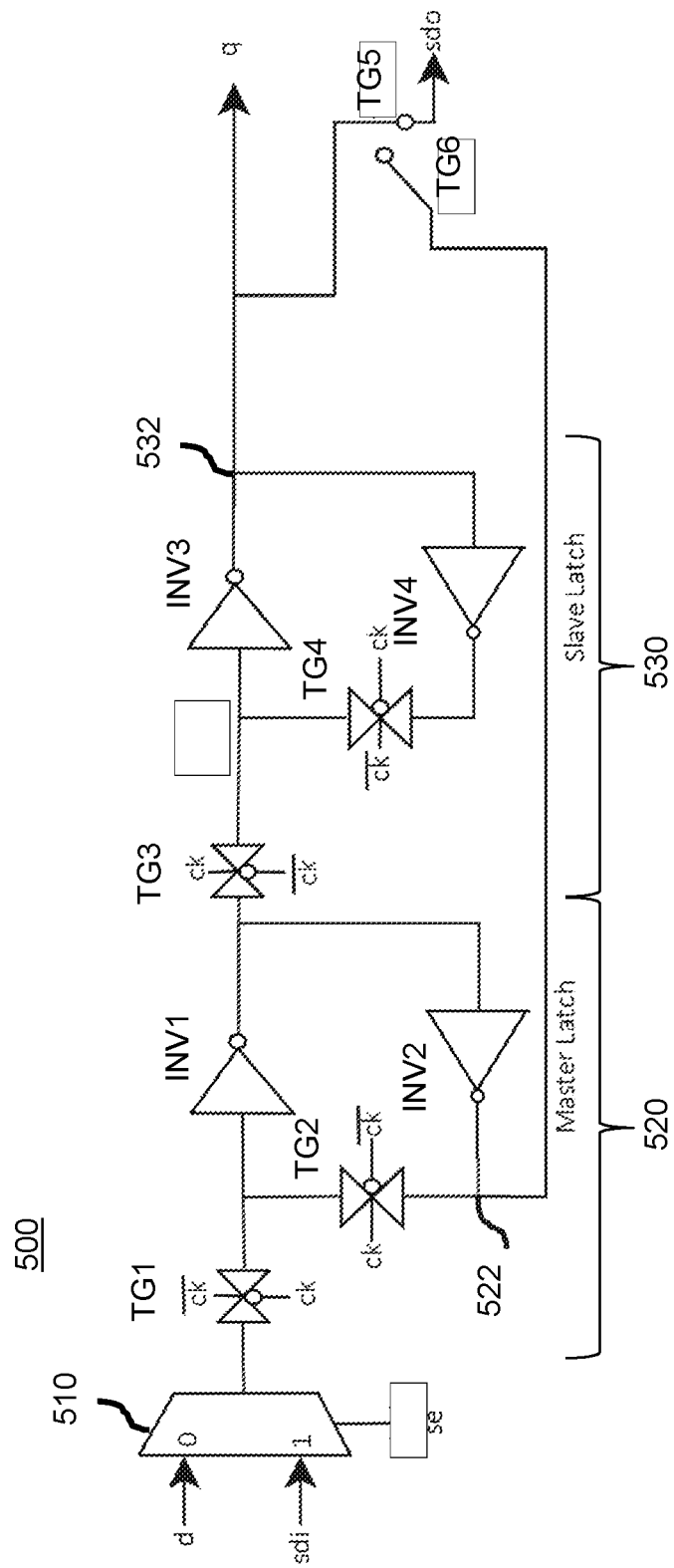
FIG. 5B is a schematic diagram of the register of FIG. 5A configured in its normal (i.e., functional) configuration.

FIG. 5B is a schematic diagram of the register 500 of FIG. 5A configured in its normal flip-flop configuration, when the control signal warmup_sel is high. In that case, TG5 is on, TG6 is off, and the register 500 operates identical to the conventional register 230 of FIGS. 2A and 2B with the bit value stored in the slave latch 530 applied from node 532 to both the q and sdo data output ports.

Figure 5C:
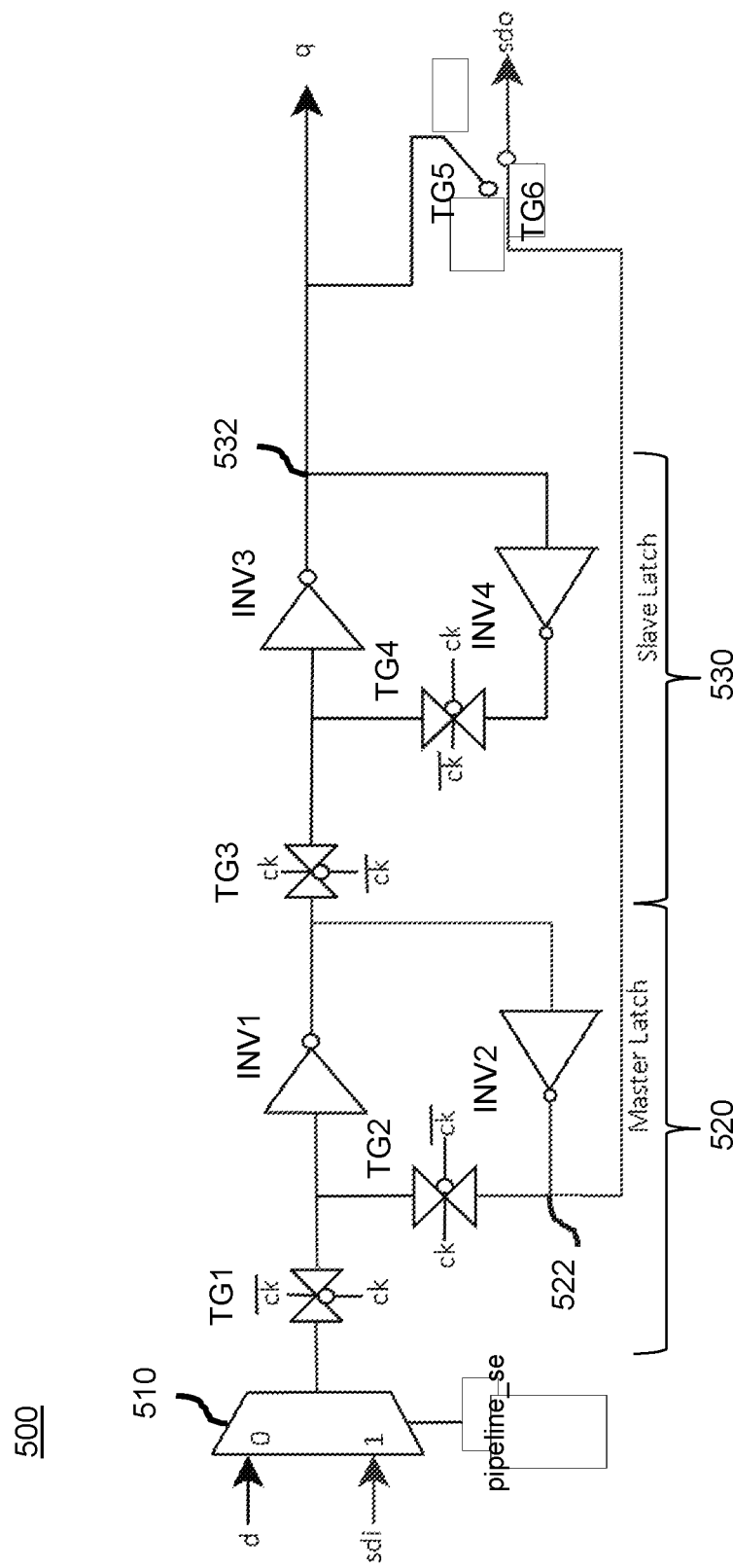
FIG. 5C is a schematic diagram of the register of FIG. 5A configured in its warm-up configuration.

FIG. 5C is a schematic diagram of the register 500 of FIG. 5A configured in its warm-up configuration, when the control signal warmup_sel is low. In that case, TG5 is off and TG6 is on, such that the bit value stored in the slave latch 530 is applied from node 532 to the q data output port, but the bit value stored in the master latch 520 is applied from node 522 to the sdo data output port. During this warm-up configuration, the clock ck is off.

During the shift phase and during the application of the launch and capture pulses of the capture phase, warmup_sel is high, and the register 500 is configured in its normal flip-flop configuration as shown in FIG. 5B. During the warm-up period of the capture phase, warmup_sel is low, and the register 500 is configured in its warm-up configuration as shown in FIG. 5C.

During the shift and capture phases of the at-speed scan testing, the register 500 is configured in the normal flip-flop configuration of FIG. 5B, and the control signal applied to mux 510 is the scan-enable signal se from the tester equipment. When the register 500 is configured in the warm-up configuration of FIG. 5C, the warm-up controller functions such that, when the scan enable se from the tester equipment is high, the pipeline_se output from the warm-up controller is also high and, when scan enable se from the tester equipment goes low, the pipeline_se depends on the configuration of the warm-up controller.

Figure 6:
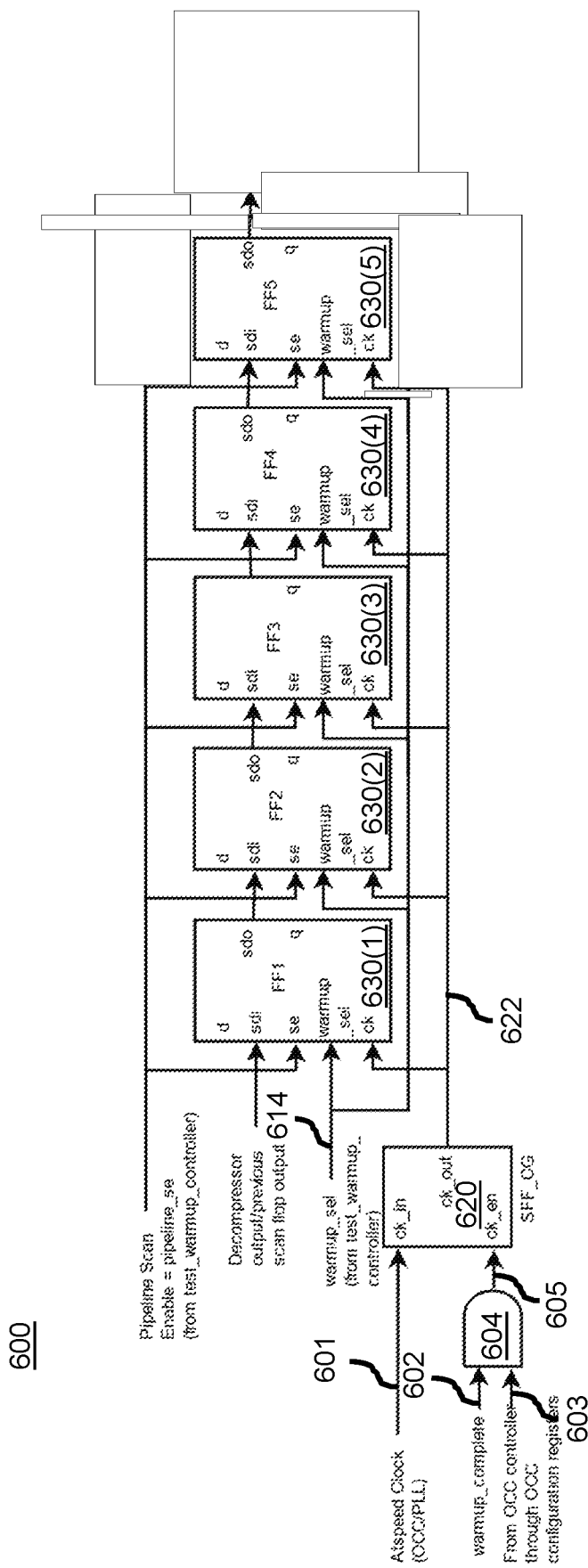
FIG. 6 is a schematic block diagram of a scan chain according to one embodiment of the present invention.

FIG. 6 is a schematic block diagram of a scan chain 600 in one possible implementation of the scan-testing circuitry of the present invention, in which the scan chain 600 has five registers 630(1)-630(5) stitched together. The scan chain 600 is analogous to the conventional scan chain 120 of FIGS. 2A and 2B, except that (i) each register 630 is based on the register 500 of FIG. 5A and (ii) an AND gate 604 has been added at the clock enable port (ck_en) of the clock gate 620. All of the registers 630 in the scan chain 600 belong to a single clock domain, but different instances of the scan chain 600 in the IC's scan-testing circuitry may belong to different clock domains.

Although not shown in FIG. 6, those skilled in the art will understand that there may be one or more hold buffers and/or a lockup latch between the sdo output of each register 630 and the sdi input of the next register 630 in the scan chain 600.

Figure 3:
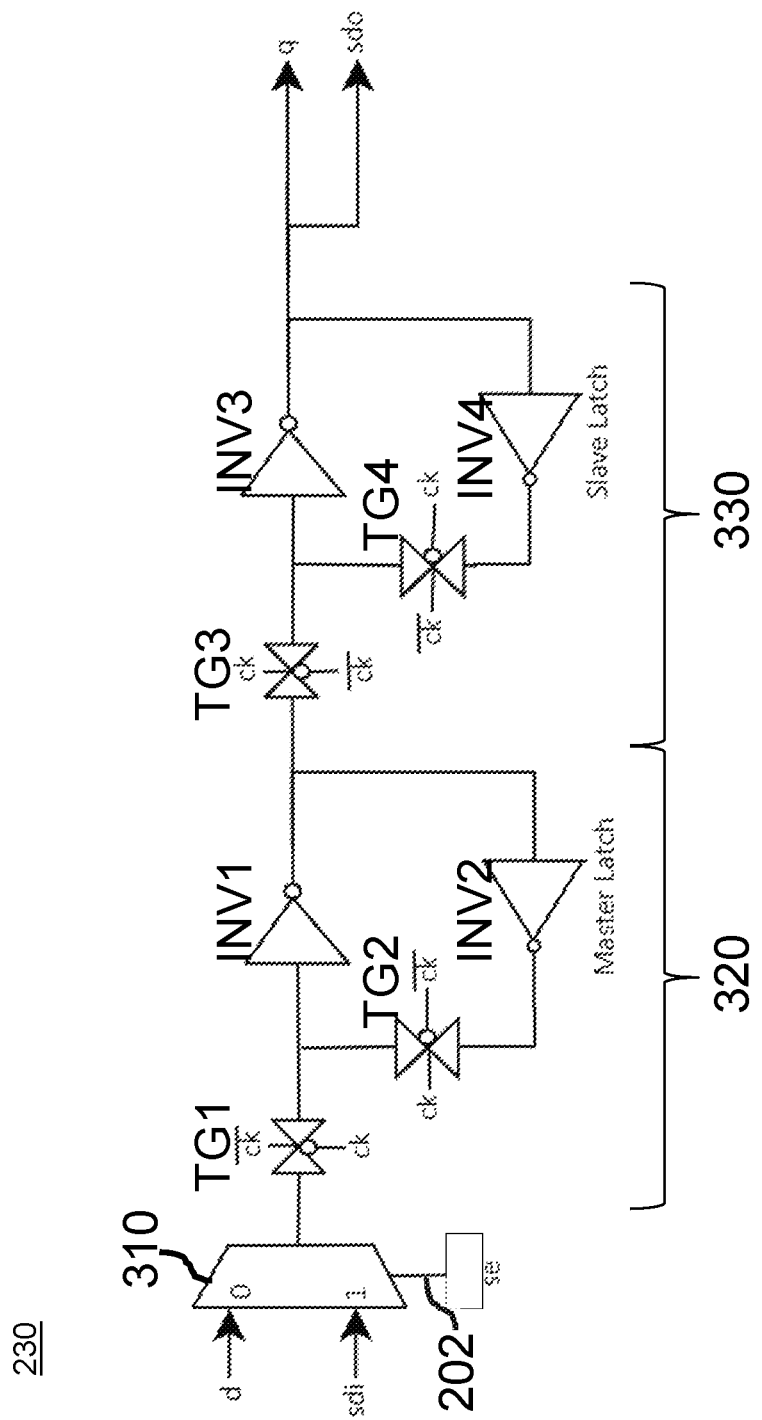
FIG. 3 is a schematic circuit diagram of a conventional register of FIGS. 2A and 2B.
Figure 4:
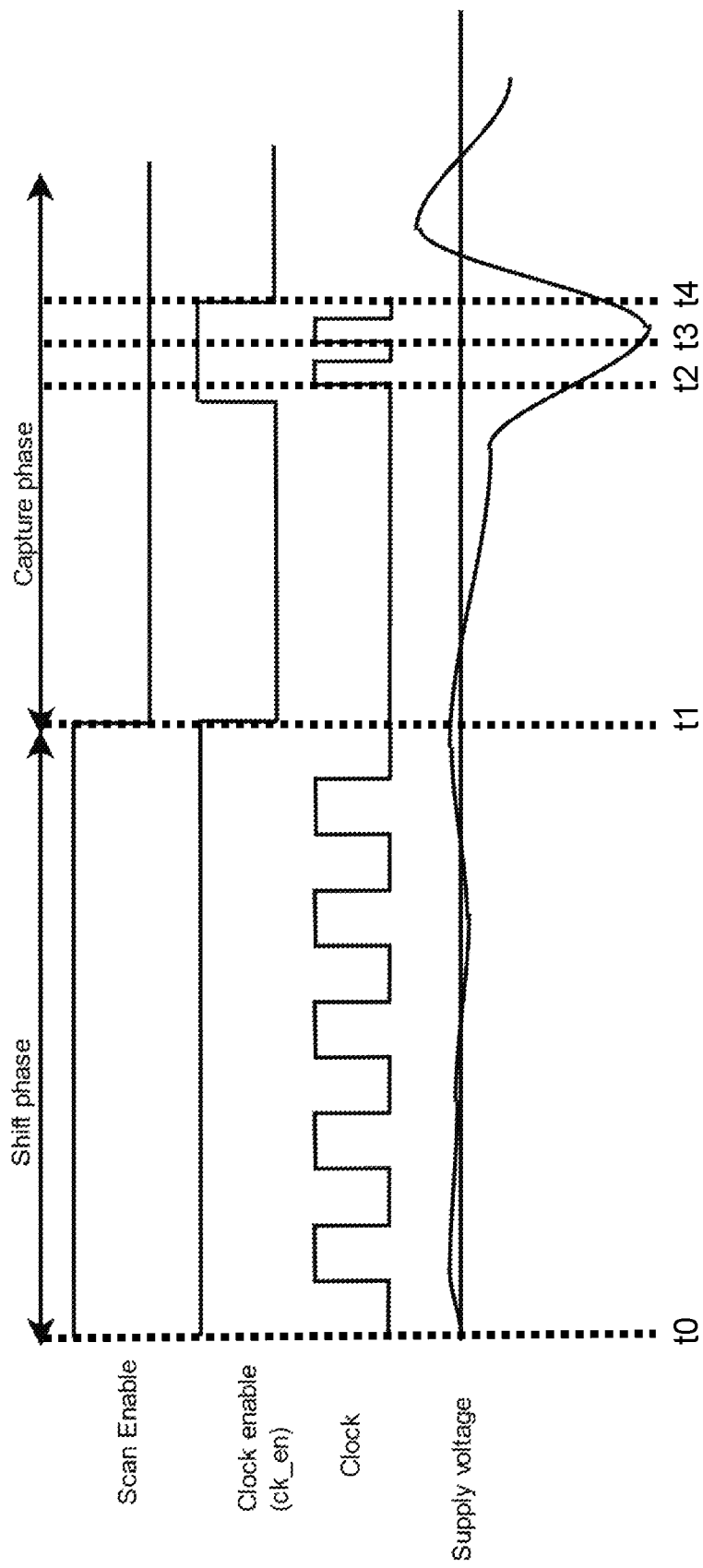
FIG. 4 is a timing diagram showing waveforms for the conventional scan-testing circuitry of FIGS. 1-3.

In some alternative implementations of the scan-testing circuitry of the present invention, one or more scan chains belonging to one clock domain may have their registers based on the register 500 of FIG. 5A, while one or more scan chains belonging to a different clock domain may have their registers based on the conventional register 230 of FIG. 3, as long as there are enough scan chains in the scan-testing circuitry with the registers 500 to achieve the goal of ensuring that the power supply rails stay sufficiently loaded during the warm-up phase such that no significant supply drop occurs when the at-speed launch and capture pulses are applied.

The warmup_sel control signal 614 applied to each register 630 is generated by a warm-up controller 800 described below in the context of FIG. 8. The AND gate 604 receives a clock-enable control signal 603 from the OCC controller as well as a warmup-complete control signal (warmup_complete) from the warm-up controller 800 and provides its logic AND output 605 to the clock-enable port (ck_en) of the clock gate 620.

In FIG. 6, the scan chain 600 is configured for the capture phase. In particular, during the capture phase, the at-speed clock 601 is applied to the clock-input port (ck_in) of the clock gate 620. During the warm-up period of the capture phase, warmup_sel is low, warmup_complete is low, the output 605 of the AND gate 604 is low, and no at-speed clock pulses are applied to the clock input ports (ck) of the registers 630.

When the warm-up period is completed, warmup_complete is driven high, and the clock-enable signal 603 from the OCC controller determines whether the at-speed clock 601 applied to the ck_in port of the clock gate 620 is applied to the ck ports of the registers 630 as the clock signal 622. The OCC controller is programmed (via the OCC configuration bits) to drive the clock-enable signal 603 high for two continuous cycles of the at-speed clock 601 in order to apply the at-speed launch and capture pulses of the capture phase as the clock signal 622 to the ck ports of the registers 630.

There are two different types of scan tests: launch-on-shift (LOS) scan tests and launch-on-capture (LOC) scan tests. In an LOS scan test, the data at the sdi input port of each register 630 is input to the master latch with the launch pulse. In an LOC scan test, the data at the d input port of each register 630 is input to the master latch with the launch pulse.

Figure 7A:
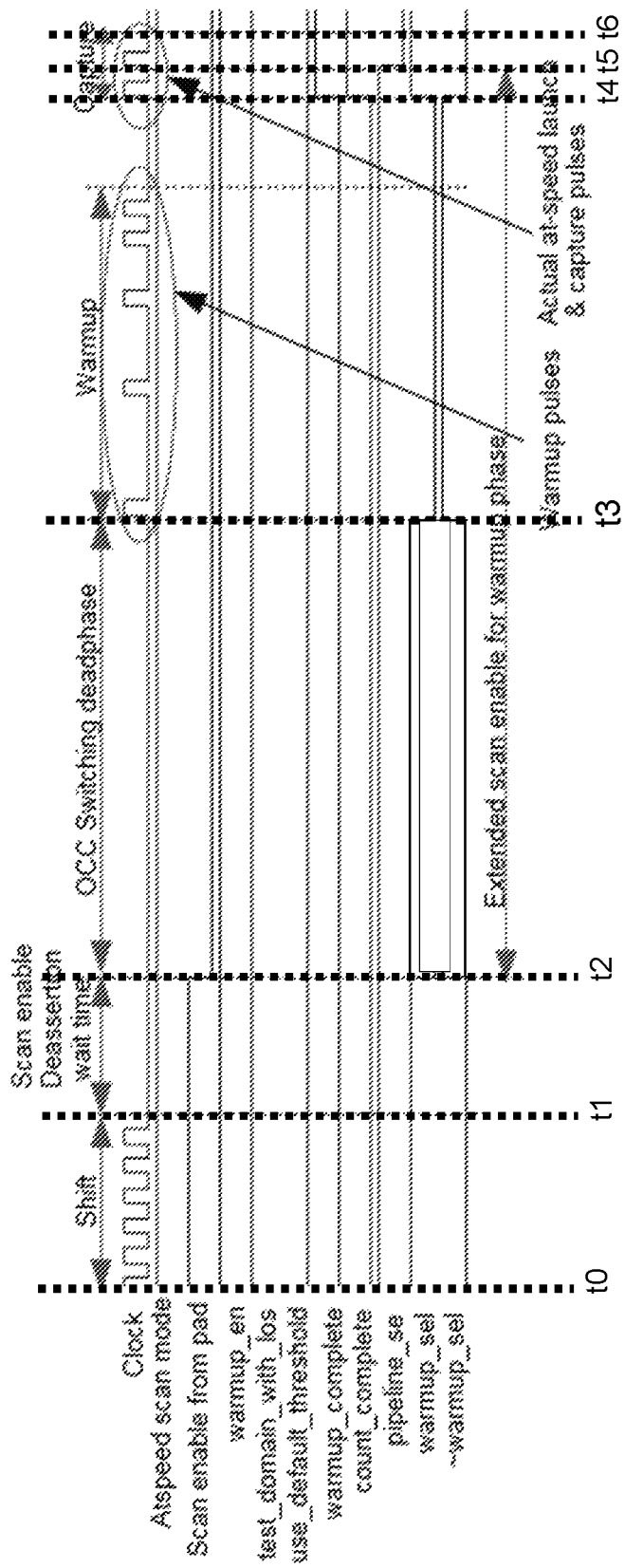
FIG. 7A is a timing diagram for LOS scan testing in accordance with one embodiment of the present invention.

FIG. 7A is a timing diagram for one possible implementation of LOS scan testing for the invention. The scan-testing circuitry is configured for the shift phase prior to time t2 (as indicated by "scan enable from pad" being high) and for the capture phase after time t2 (as indicated by "scan enable from pad" being low).

In particular, up until time t1, the tester clock is used to shift incoming data into and outgoing data out of the registers 630 of each scan chain 600. At time t1, the registers 630 contain only the new, incoming data, and the tester clock is no longer applied to the registers 630. The time period from time t1 to time t2 is a scan enable de-assertion wait time, which can be correlated with the insertion delay of the pad. At time t2, the off-chip tester equipment drives "scan enable from pad" low to end the shift phase and begin the capture phase of scan testing. Although not represented in FIG. 7A, between time t2 and time t3, the clock signal is switched from the slow tester clock to the fast at-speed clock. The time period from time t2 to time t3 is an OCC switching dead time. No clock signal is applied to the registers 630 between time t1 and time t3.

At time t3, warmup_sel is driven low to begin the warm-up period of the capture phase. Driving warmup_sel low causes the registers 630 in the scan chain 600 to be configured into their warm-up configuration as shown in FIG. 5C, which initiates a combinational flow of data from node 522 in the master latch 520 of the first register 630(1) to the sdo output of the first register 630(1) to the sdi input of the second register 630(2) through the inverters INV1 and INV2 of the second register 630(2) to the sdo output of the second register 630(2) to the sdi input of the third register 630(3), and so on through the entire scan chain 600. This combinational flow of data through the inverters of the master latches 520 of the registers 630 helps to keep the power supply rail voltage sufficiently loaded during the warm-up period of the capture phase. Note that, when there are one or more hold buffers and/or a lockup latch between pairs of consecutive registers, those hold buffers and/or that lockup latch also contribute to keeping the power supply rail voltage loaded with current.

Figure 8:
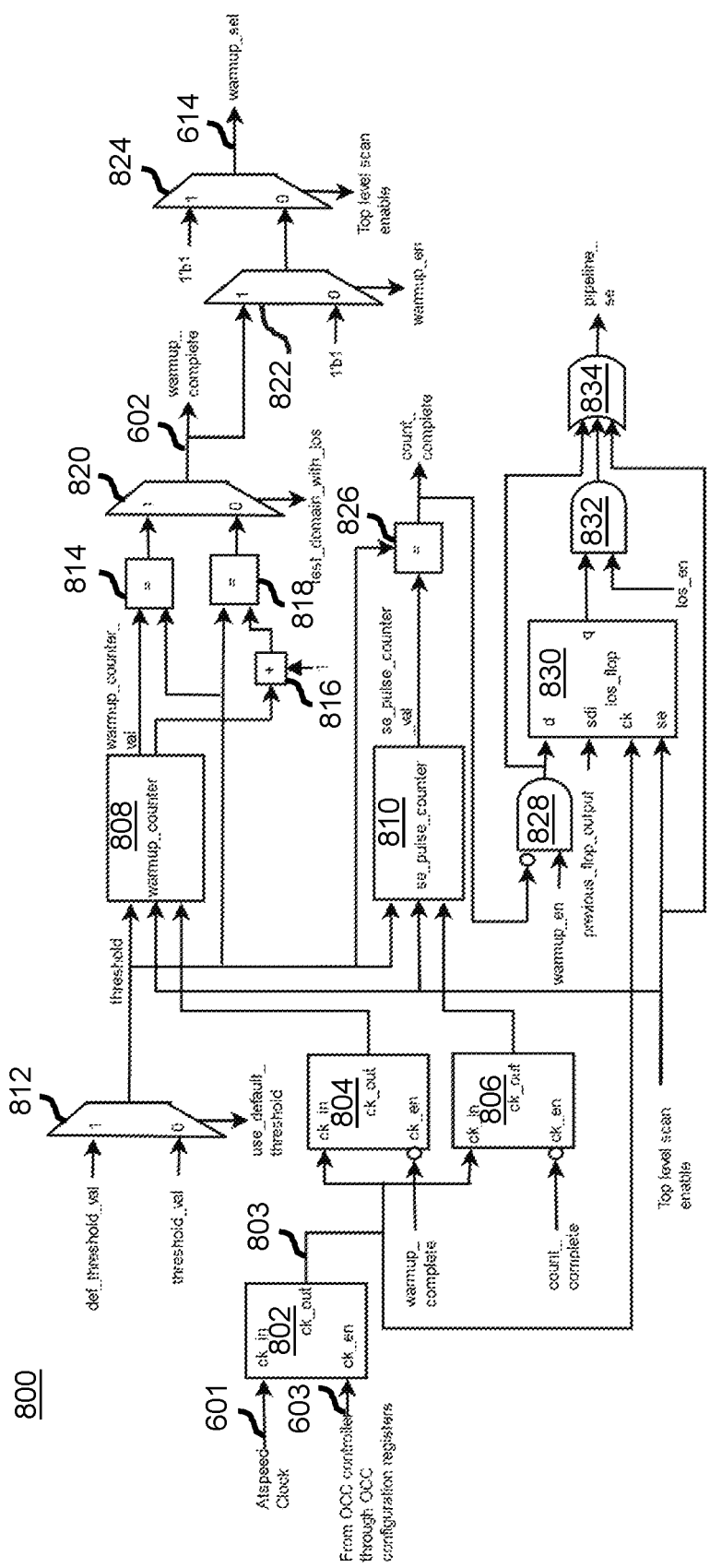
FIG. 8 is a schematic block diagram of an on-chip warm-up controller according to one embodiment of the present invention.

In FIG. 7A, from time t3 to time t4, the OCC controller causes five warm-up pulses to be applied to the warm-up controller 800 of FIG. 8. The number and timing of these warm-up pulses is dictated by the OCC configuration bits. In this particular example, the OCC controller generates the five warm-up pulses faster and faster over the course of the warm-up period. In other embodiments, the number and/or timing of the warm-up pulse may be different from those shown in FIG. 7A, including a sequence of consecutive warm-up pulses at a constant rate.

At time t4, after the fifth and final warm-up pulse is generated, the warm-up controller 800 of FIG. 8 determines that the warm-up period is completed, as indicated by warmup_complete being driven high. Referring to the AND gate 604 of FIG. 6, this enables the clock-enable signal 603 from the OCC controller to determine whether the at-speed clock 601 will be applied to the registers 630 depending on the configuration of the OCC configuration bits.

At time t4, the OCC controller causes the launch pulse to be applied to the registers 630. Because pipeline_se is still high at time t4, the mux 510 of FIG. 5A for each register 630 in the scan chain 600 will select the data at the sdi input port to launch into the master latch 520.

At time t5, pipeline_se is driven low, thereby causing the mux 510 of FIG. 5A for each register 630 in the scan chain 600 to select the data at the d input port. As such, when the OCC controller causes the capture pulse to be applied to the registers 630 at time t5, the output response of the functional logic, driving the d input of the registers 630, gets stored in the registers 630 which then drive the q output of the registers 630.

At time t6, the capture phase of the LOS scan testing is completed. Although not shown in FIG. 7A, following time t6, the clock will be switched from the fast at-speed clock back to the slow tester clock, and the tester equipment will drive the scan enable signal se high to start the shift phase for the next test pattern of scan testing, during which the sdi data stored in the slave latches 530 of the registers 630 will be shifted out as the new, incoming data is shifted in.

Figure 7B:
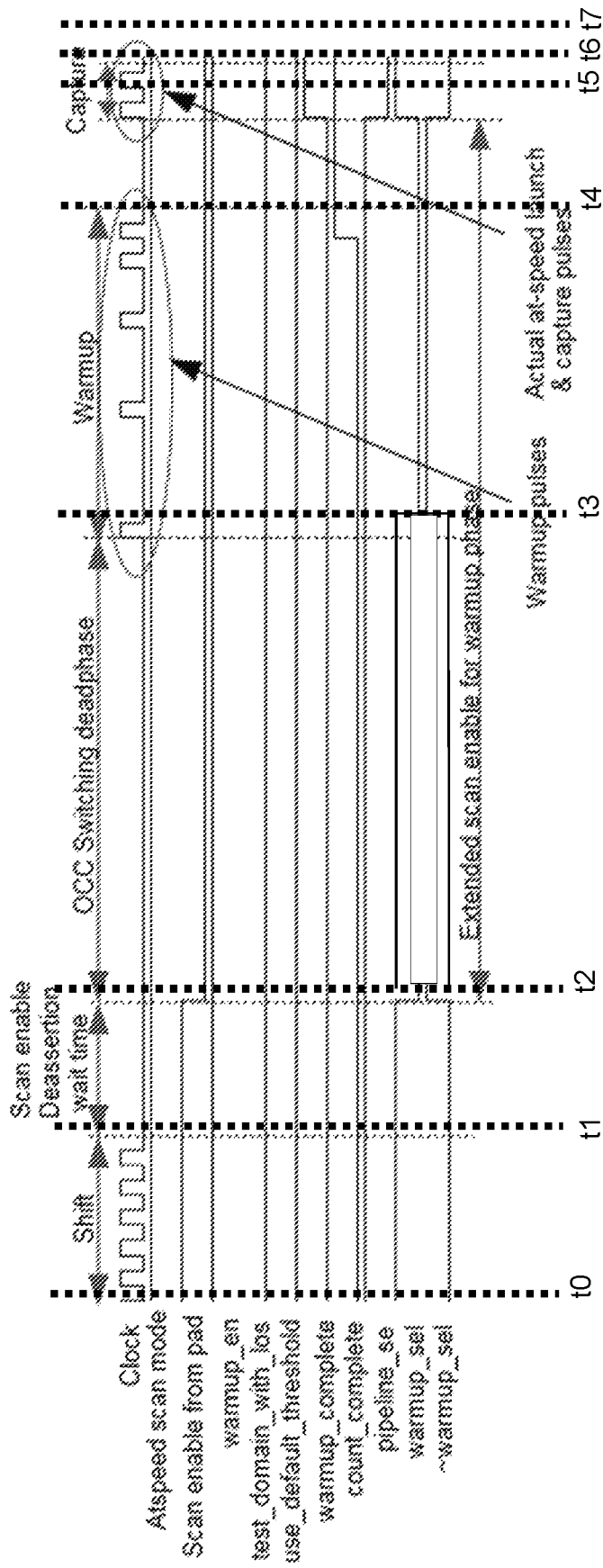
FIG. 7B is a timing diagram for LOC scan testing in accordance with one embodiment of the present invention.

FIG. 7B is a timing diagram for one possible implementation of LOC scan testing for the invention. The timing of the LOC scan testing of FIG. 7B is identical to the timing of the LOS scan testing of FIG. 7A except for the following signals: (1) In the LOC scan testing of FIG. 7B, the count_complete signal is driven high after the second-to-last warm-up pulse at time t4 of FIG. 7B rather than after the last warm-up pulse at time t4 of the LOS scan testing of FIG. 7A; and (2) In the LOC scan testing of FIG. 7B, the pipeline_se signal is driven low at the beginning of the launch pulse at time t5 of FIG. 7B rather than at the beginning of the capture pulse at time t5 of the LOS scan testing of FIG. 7A. As such, the data that is launched through the registers 630 in the scan chain 600 will be the output data from the functional logic driving the d inputs of the registers 630, not the sdi data from the previous registers, as is appropriate for LOC scan testing.

FIG. 8 is a schematic block diagram of the on-chip warm-up controller 800 according to one embodiment of the invention. The warm-up controller 800 generates the signals required to facilitate the generation of warm-up pulses: an extended scan enable control signal and control signals for preserving the initialization vector, controlling the number of warm-up pulses, and supporting either LOS or LOC scan testing.

Note that an integrated circuit will have one warm-up controller 800 for each set of one or more scan chains 600 corresponding to a different clock domain. During the shift phase of scan testing, each warm-up controller 800 is under reset (i.e., disabled).

One purpose of the warm-up controller is to control the timing of driving the pipeline_se control signal low to achieve either LOS scan testing or LOC scan testing, as appropriate. In order to perform that function, circuitry within the warm-up controller 800 is operated during the warm-up period of the capture phase when scan enable from the tester equipment is driven low and the clock source has been switched to at-speed clock, thereby helping to keep the power supply rail voltage charged.

In particular, during the capture phase of scan testing, the warm-up controller 800 generates the warmup-select control signal (warmup_sel), the warmup-complete control signal (warmup_complete), and the pipeline scan-enable control signal (pipeline_se) that are applied to the scan chain 600 of FIG. 6. The warm-up controller 800 also generates the count_complete control signal which is used only internally within the warm-up controller 800.

The warm-up controller 800 operates based on values stored in the following programmable registers that are programmed in the warm-up test data registers by the off-chip tester equipment:

- warmup_en: Warmup-enable control signal enables warm-up pulses to be applied to the warm-up controller and enables the warm-up configuration for the registers 630 in FIG. 6.
- use_default_threshold: Selects between default and programmable threshold values that identify the number of warm-up pulses.
- threshold_val[j:0]: Programmable threshold value, applicable only when use_default_threshold is low. Register width depends on the number of warm-up pulses required.
- test_domain_with_los: Selects between generation of LOS and LOC patterns when warm-un is enabled.
- los_en: Enables the use of pipeline scan enable. For warm-up, this is to be programmed high (1'b1).

Note that the default_threshold value (def_threshold_val) is hard-coded into the warm-up controller 800.

The warm-up controller 800 generates the following parameters:

- warmup_complete: Warm-up complete control signal that indicates when the warm-up period is completed.
- count_complete: Count complete control signal that indicates that the threshold number of warm-up pulses has been reached.
- pipeline_se: Pipeline scan-enable control signal that provides an elongated scan enable needed for the warm-up period.
- warmup_sel: Active-low warmup select control signal that indicates that the warm-up mode is selected.

The OCC configuration register bits are pre-programmed to suitable values to provide warm-up pulses as well as the launch and capture pulses of the capture phase of scan testing. The OCC configuration register (not shown in the figures) should be wide enough to support the required number of clock pulses. To make use of pipeline scan enable, los_en and warmup_en are both set high.

The warm-up controller 800 operates as follows. When the OCC controller drives the clock-enable signal 603 high, the clock gate 802 will allow pulses in the at-speed clock 601 to be applied as warm-up pulses 803 to the clock gates 804 and 806, which in turn will allow those warm-up pulses 803 to reach the warmup_counter 808 and the se_pulse_counter 810 when warmup_complete and count_complete are low, respectively. Each counter generates a corresponding counter value that gets compared to a corresponding counter threshold value (i.e., either the default_threshold value (def_threshold_val) or the programmed threshold value (threshold_val), depending on the use_default_threshold control signal applied to mux 812. The default value can be different for different clock domains having different warm-up controllers 800 depending on their frequencies.

The warmup_counter, a self-gated down counter, running on at-speed clock, comes out of reset. The warmup_counter_val from the warmup_counter 808 is compared to the selected counter threshold value by the comparator 814, which generates a high output signal when those two values are equal. The warmup_counter_val from the warmup_counter 808 is also incremented at summer 816 and then the incremented warmup_counter_val is compared to the selected counter threshold value by the comparator 818, which generates a high output signal when those two values are equal. The two comparator outputs are applied to mux 820, which selects one of those two values depending on whether LOS or LOC scan testing is selected (as reflected by the test_domain_with_los control signal). The output of the mux 820 is the warmup_complete control signal 602.

The output of the mux 820 is also applied to the mux 822, which in combination with the mux 824, generates the warmup_sel control signal based on the warmup_en control signal and top-level scan-enable control signal se from the tester equipment.

The se_pulse_counter, a self-gated down counter, also running on at-speed clock, comes out of reset and generates the pipeline_se through the los_flop. The se_pulse_counter_val from the se_pulse_counter 810 is compared to the selected counter threshold value by the comparator 826, which generates a high output signal when those two values are equal. The output of the mux 820 is the count_complete control signal. The negated value of count_complete is also applied to AND gate 828 along with warmup_en. The output of the AND gate 828 is applied to the d input port of the flip-flop 830, which, along with AND gate 832 and OR gate 834, generates the pipeline_se control signal.

All the programmable test data registers—warmup_en, threshold_val, use_default_threshold, test_domain_with_los, los_en can be controlled during LBIST (logic built-in self-testing) as well through the replica registers for these registers.

For LOS scan testing, TG5 of FIG. 5A, which was turned off when the top-level scan-enable control signal se went low, will be turned on when the control signal warmup_sel goes high, that is, one cycle before the signal pipeline_se goes low. At the same time, TG6 is turned off. Thus, the last shift-cycle values that were preserved on the q output ports of the registers 630, also become available on the sdo output ports driving the sdi input of the next register 630 in the scan chain 600 (through which the transition will be launched) and the next at-speed clock pulse becomes the launch pulse after which the signal pipeline_se goes low. The next at-speed clock pulse after the launch pulse is the capture pulse.

In this case, both the se_pulse_counter and the warmup_counter count to the threshold value. To create LOS patterns, the signal test_domain_with_los should be high as controlled by a programmable test data register.

For LOC (launch on capture) patterns, TG5, which was turned off when the top-level scan-enable control signal se went low, will be turned on when the signal pipeline_se goes low (the warmup_sel signal goes high at the same time). At the same time, TG6 is turned off. The transition will be launched through the q output ports or d input ports of the registers 630 which have the last shift values on the functional logic preserved.

In this case, the se_pulse_counter 810 counts to the threshold value and the warmup_counter counts 808 to the threshold value but the comparison is made between the (warmup_counter_val+1) and threshold value. For LOC scan testing, the signal test_domain_with_los should be programmed low through the corresponding test data register.

Although not shown in FIGS. 7A, 7B, and 8, pipelines may be added on the outputs and internal signals of the warm-up controller 800 to cater to any timing requirements of the register 500 shown in FIG. 5A or any requirement of the integrated circuit using the warm-up controller 800. The pipelines should be inserted such that they do not impact the functionality of the warm-up controller 800, the register 500, or the type of at-speed testing being done (i.e., LOC or LOS).

The invention has been described in the context of the registers 500 of FIG. 5A having clock-controlled transmission gates TG1-TG6, where each transmission gate comprises an n-type transistor and a p-type transistor connected in parallel with complementary clock signals applied to their gate/base terminals. In general, the invention can be implemented using other types of clock-controlled switches, including individual n-type or p-type transistors.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An integrated circuit, comprising:
   functional logic that processes incoming data and generates corresponding outgoing data; and
   registers stitched into a scan chain that supports scan testing of the functional logic, wherein:
      each register comprises a master latch followed by a slave latch; and
      each register supports (i) a first configuration in which the slave latch is connected to a first output of the register and (ii) a warm-up configuration in which a node in the master latch is connected directly to the first output of the register bypassing the slave latch;
   a warm-up controller that generates a warmup-select control signal that determines whether each register is configured in the first configuration or in the warm-up configuration;
   wherein the warm-up controller generates a scan-enable control signal (SE) that determines whether each register selects data from the register's SDI input or the register's D input for launching a transition at a launch pulse of a capture phase of at-speed scan testing.

2. The integrated circuit of claim 1, wherein, when the registers are configured in the warm-up configuration, a combinational flow of data propagates through the master latches without affecting data stored in the slave latches.

3. The integrated circuit of claim 2, wherein the master latch of each register comprises a pair of inverters through which the combinational flow of data propagates when the register is in the warm-up configuration.

4. The integrated circuit of claim 1, wherein:
   the scan testing comprises a shift phase followed by a capture phase;
   during the shift phase, using a slower clock, at least one of (i) incoming scan test data is shifted into the registers and (ii) outgoing scan test data is shifted out of the registers;
   during the capture phase, using launch and capture pulses of a faster clock, the outgoing scan test data from the functional logic under test is captured by the registers; and
   during a warm-up period after termination of the slower clock and before application of the launch and capture pulses, the registers are configured in the warm-up configuration.

5. The integrated circuit of claim 4, wherein, during the warm-up period, the registers in the scan chain are not clocked.

6. The integrated circuit of claim 1, wherein one or more scan chains in the integrated circuit comprise conventional flip-flops that do not support the warm-up configuration.

7. The integrated circuit of claim 1, wherein each register comprises a pair of switches selectively connecting the first output of the register to either the slave latch or the node in the master latch.

8. An integrated circuit, comprising:
   functional logic that processes incoming data and generates corresponding outgoing data; and
   registers stitched into a scan chain that supports scan testing of the functional logic, wherein:
      each register comprises a master latch followed by a slave latch; and each register supports (i) a first configuration in which the slave latch is connected to a first output of the register and (ii) a warm-up configuration in which a node in the master latch is connected directly to the first output of the register bypassing the slave latch;

a warm-up controller that generates a warmup-select control signal that determines whether each register is configured in the first configuration or in the warm-up configuration;

wherein the warm-up controller comprises counters that count warm-up pulses to determine when to change the warmup-select control signal.

9. The integrated circuit of claim 8, wherein the warm-up controller generates a scan-enable control signal (SE) that determines whether each register selects data from the register's SDI input or the register's D input for launching a transition at a launch pulse of a capture phase of at-speed scan testing.

10. The integrated circuit of claim 1, wherein the warm-up controller selectively generates the scan enable control signal to support either launch-on-shift (LOS) scan testing or launch-on-capture (LOC) scan testing.

11. The integrated circuit of claim 1, wherein the warm-up controller comprises counters that count warm-up pulses to determine when to change the scan enable control signal.

12. An integrated circuit, comprising:
  functional logic that processes incoming data and generates corresponding outgoing data; and
  registers stitched into a scan chain that supports scan testing of the functional logic, wherein:
    each register comprises a master latch followed by a slave latch; and
  each register supports (i) a first configuration in which the slave latch is connected to a first output of the register and (ii) a warm-up configuration in which a node in the master latch is connected directly to the first output of the register bypassing the slave latch;
  wherein:
    when the registers are configured in the warm-up configuration, a combinational flow of data propagates through the master latches without affecting data stored in the slave latches;
    the master latch of each register comprises a pair of inverters through which the combinational flow of data propagates when the register is configured in the warm-up configuration;

the scan testing comprises a shift phase followed by a capture phase;

during the shift phase, using a slower clock, at least one of (i) incoming scan test data is shifted into the registers and (ii) outgoing scan test data is shifted out of the registers;

during the capture phase, using launch and capture pulses of a faster clock, the outgoing scan test data from the functional logic under test is captured by the registers;

during a warm-up period after termination of the slower clock and before application of the launch and capture pulses, the registers are configured in the warm-up configuration;

during the warm-up period, the registers in the scan chain are not clocked;

each register comprises a pair of switches selectively connecting the register's first output to either the slave latch or the node in the master latch;

the integrated circuit further comprises a warm-up controller that generates a warmup-select control signal that determines whether each register is configured in the normal configuration or in the warm-up configuration;

the warm-up controller comprises counters that count warm-up pulses to determine when to change the warmup-select control signal;

the warm-up controller generates a scan-enable control signal that determines whether each register selects data from the register's SDI input or the register's D input for launching a transition at the launch pulse of the capture phase of at-speed scan testing;

the warm-up controller selectively generates the scan-enable control signal to support either launch-on-shift (LOS) scan testing or launch-on-capture (LOC) scan testing; and the warm-up controller comprises counters that count warm-up pulses to determine when to change the scan-enable control signal.

13. The integrated circuit of claim 12, wherein one or more scan chains in the integrated circuit comprise conventional flip-flops that do not support the warm-up configuration.

* * * * *